United States Patent
Girardeau (10) Patent No.: US 9,497,569 B2
(45) Date of Patent: Nov. 15, 2016

(54) SYSTEM AND METHOD FOR CORRELATIVE SAMPLING AND COMPRESSION OF QUASI-PERIODIC MACHINE PARAMETER SENSOR DATA IN AN INDUSTRIAL FACILITY

(71) Applicant: UPTIME SOLUTIONS, Jacksonville, FL (US)

(72) Inventor: James Girardeau, Austin, TX (US)

(73) Assignee: UPTIME SOLUTIONS, Jacksonville, FL (US)

( * ) Notice: Subject to any disclaimer, the term of this patent is extended or adjusted under 35 U.S.C. 154(b) by 144 days.

(21) Appl. No.: 14/205,750

(22) Filed: Mar. 12, 2014

(65) Prior Publication Data

US 2015/0264586 A1  Sep. 17, 2015

(51) Int. Cl.
*H04W 4/00* (2009.01)
*G01R 23/00* (2006.01)

(52) U.S. Cl.
CPC .............. *H04W 4/005* (2013.01); *G01R 23/00* (2013.01)

(58) Field of Classification Search
None
See application file for complete search history.

(56) References Cited

U.S. PATENT DOCUMENTS

| | | | |
|---|---|---|---|
| 5,720,066 A | 2/1998 | Kim | |
| 6,370,957 B1 | 4/2002 | Filippenko et al. | |
| 6,789,422 B1 | 9/2004 | Ward, Jr. | |
| 6,801,877 B2 * | 10/2004 | Schiltz | G01H 1/003 702/183 |
| 7,283,914 B2 | 10/2007 | Poorman et al. | |
| 7,409,261 B2 | 8/2008 | Jalluri et al. | |
| 8,100,009 B2 | 1/2012 | Dyer | |
| 2006/0209927 A1 * | 9/2006 | Khandekar | H04L 5/0048 375/146 |
| 2007/0220561 A1 * | 9/2007 | Girardeau | H04N 21/2368 725/80 |
| 2009/0213968 A1 * | 8/2009 | Tormalehto | H04J 11/00 375/343 |
| 2011/0108181 A1 | 5/2011 | Cai et al. | |

FOREIGN PATENT DOCUMENTS

WO    9905486 A2    2/1999

OTHER PUBLICATIONS

"What Are Accelerometers?", <http://www.omega.com/prodinfo/accelerometers.html>, Accessed May 30, 2014, 3 pages.
"Autocorrelation", <https://en.wikipedia.org/wiki/Autocorrelation>, Accessed May 30, 2014, 9 pages.
"Cross-correlation", <https://en.wikipedia.org/wiki/cross-correlation>, Accessed May 30, 2014, 5 pages.
"TS-1X Wireless Data Collector", <http://uptime-solutions.us/?page id=12>, Accessed May 30, 2014, 2 pages.

* cited by examiner

*Primary Examiner* — Charles C Jiang
*Assistant Examiner* — Kyaw Z Soe (57) ABSTRACT

A sensor sampling system comprises a base station and a field unit. The field unit receives a quasi-periodic signal representing machine parameters monitored by a machine sensor, and samples a first portion of the quasi-periodic signal to generate a first reference waveform. The field unit subsequently samples a second portion of the quasi-periodic signal to generate a first sample waveform. Finally, the field unit generates a first delta data set representing a difference between the first reference waveform and the first sample waveform and wirelessly transmits a representation of the first delta data set for reception by the base station.

22 Claims, 4 Drawing Sheets

SYSTEM AND METHOD FOR CORRELATIVE SAMPLING AND COMPRESSION OF QUASI-PERIODIC MACHINE PARAMETER SENSOR DATA IN AN INDUSTRIAL FACILITY

BACKGROUND

1. Field of the Disclosure

The present disclosure relates generally to industrial facilities and, more particularly, to monitoring of machine parameters in industrial facilities.

2. Description of the Related Art

Industrial facilities, such as manufacturing facilities, laboratories, research facilities, refineries, other structures, and the like, often use sensors to monitor machine parameters. For example sensors may be used to measure machine parameters such as vibration, acceleration, velocity, sound, electric field, speed, torque, displacement, and the like. Each sensor produces an analog output voltage, current, or digital representation of the machine parameter being measured. In many cases, a field unit samples the signal output by the sensor and transmits data representing the sampled signal over a wireless network to a base unit. Often times the field units are battery powered and have limited bandwidth for transmitting the signals produced by the sensors monitoring the machine parameters. Consequently, transmission of the data representing the sampled sensor signals often taxes the wireless network and limits the operational time of the field units on a given battery charge, resulting in delays, transmission errors, field unit failures, frequent battery replacement, inefficiencies, greater expense, and safety concerns.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-4 illustrate example implementations of a sensor sampling system implementing field units (e.g. battery-powered field units) that takes advantage of the fact that there is significant duplication of information between cycles of a quasi-periodic signal so as to compress or otherwise reduce the amount of data used to represent a sampled quasi-periodic signal from a machine sensor, and thus reduce the transmit time and power needed to wirelessly transmit this data, which permits the field unit to operate longer on a given battery charge. In at least one embodiment, the sensor sampling system creates a delta data set based on a quasi-periodic signal produced by a machine sensor sensing one or more machine parameters of at least one machine in an industrial facility. The field unit is communicatively coupled to the machine sensor such that the field unit receives a quasi-periodic signal from the machine sensor. The field unit generates a reference waveform by sampling at least a portion of at least one cycle of the quasi-periodic signal, and then transmits a representation of the reference waveform to a base station. The field unit then generates one or more sample waveforms by sampling the quasi-periodic signal again for one or more subsequent cycles of the quasi-periodic signal. For each sample waveform, the field unit determines a correlation of the reference waveform and the sample waveform to phase-align the reference waveform and the sample waveform. With the reference waveform and the sample waveform phase-aligned, the field unit determines the delta data set based on the difference between the reference and sample waveforms. The field unit filters and compresses the delta data set and wirelessly transmits the compressed delta data set to the base station. The base station then generates a reconstruction or other representation of the sample waveform using the reference waveform and the delta data set. In this manner, the field unit typically is required to transmit less data than a conventional set that transmits each sampled waveform because the delta data set typically comprises less data overall due to the similarities between cycles of the quasi-periodic signal. As such, the transmitter of the field unit is required to transmit less data, and thus less radio transmit time and less battery charge need be allocated for transmitter operation.

As used herein, the term "machine" refers to a structure or combination of structures subject to environmental changes or mechanical forces, either self-generated or externally applied. Structures with self-generated mechanical forces include, for example boilers, compressors, generators, transformers, industrial robots, rotating bearings, mills, lathes, grinders, saws, welders, ovens, mining equipment, and the like. Structures with externally applied mechanical forces include, for example, bridges and other spans, buildings, cranes, boat hulls, highways, and the like. Moreover, it will be appreciated that some machines may comprise structures subject to both self-generated mechanical forces and externally-applied mechanical forces.

Figure 1:
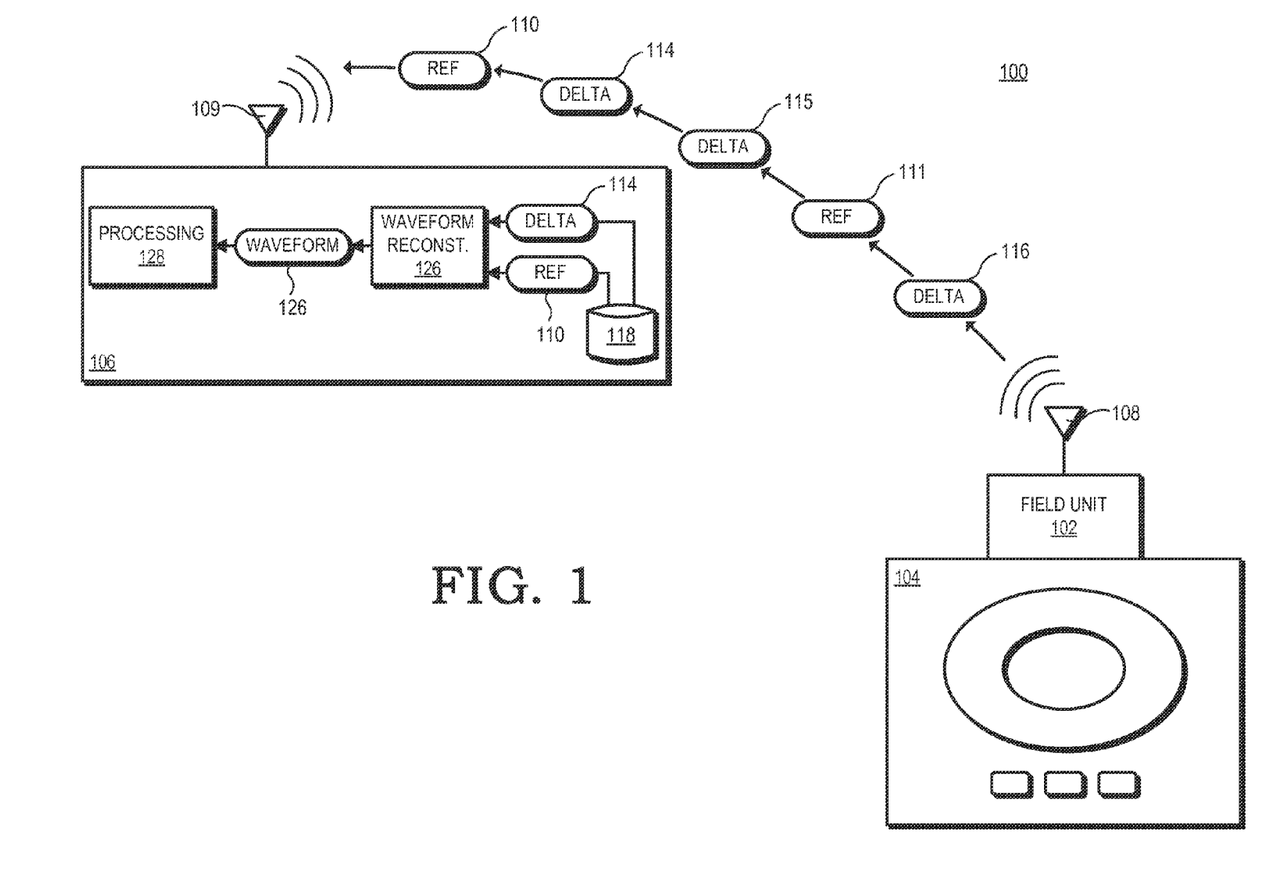
FIG. 1 is a block diagram illustrating a sensor sampling system in accordance with some embodiments.

FIG. 1 illustrates a sensor sampling system 100 for wireless transmission of machine parameter data from a field unit 102 detecting at least one machine parameter of a machine 104 in an industrial facility to a base station 106 in accordance with some embodiments. For example, in some embodiments the field unit 102 may detect any of a variety of machine parameters that tend to be quasi-periodic in nature, including, for example, vibration, pressure, sound, voltage, current, and the like.

Conventionally, a field unit receives a quasi-periodic signal representing the quasi-periodic machine parameter, samples the quasi-periodic signal to create a sample waveform, and wirelessly transmits data representing the entirety of the sample waveform to a base station. However, transmitting this amount of data over a wireless network often taxes the wireless network and limits the operational time of battery-powered field units on a given battery charge, resulting in delays, transmission errors, field unit failures, frequent battery replacement, inefficiencies, greater expense, and safety concerns.

In contrast, in the illustrated embodiments, a field unit 102 of the sampling system 100 takes advantage of the duplicate information between cycles of the quasi-periodic signal by creating a reference waveform 110 out of one cycle, a portion of one cycle, or more than one cycle of the quasi-periodic signal. The field unit 102 phase-aligns and compares the reference waveform 110 with subsequent sample waveforms sampled from the quasi-periodic signal, to produce delta data sets representing the difference between the reference waveform 110 and each sample waveform. Due to the quasi-periodic nature of the sensed signal, there typically is substantial duplication or overlap between the reference waveform and the sample waveform, resulting in a small differential, and thus a delta data set that is smaller than the data set representing the sample waveform. Moreover, filtering and compression techniques can be applied, thereby further reducing the size of the delta data set. As such, wirelessly transmitting compressed delta data sets 114, 115 often requires fewer resources than would be required to transmit the sample waveform itself.

The field unit 102 transmits a representation of the reference waveform 110 and the compressed delta data set 114 to the base station 106 over a wireless network via a wireless transmitter 108, so that the base station can use the reference waveform 110 and the compressed delta data set 114 to reconstruct the sample waveform. In the illustrated embodiment, the field unit 102 is depicted as transmitting the reference waveform 110 in a separate transmission from the compressed delta data set 114 to decrease the load of a single transmission, but in some embodiments any combination of reference waveforms and compressed delta data sets may be sent in a single transmission.

The base station 106 stores the reference waveform 110 and the compressed delta data set 114 in a data store 118 when received over the wireless network via wireless receiver 109. The data store 118 may be configured to maintain the reference waveform 110 and the compressed delta data set 114 for any given period of time according to any conditions. The data store 118 may store the compressed delta data set 114 or may store the delta data set after it has been decompressed by a decompressor.

The base station 106 further comprises a waveform reconstruction module 120 for reconstructing or otherwise generating a representation of each sample waveform corresponding to each delta data set. The waveform reconstruction module 120 is communicatively coupled to the data store 118, such that after the reference waveform 110 and the delta data set 114 have been received by the base station 106 and stored in the data store 118, the waveform reconstruction module 120 may retrieve the delta data set 114 and the corresponding reference waveform 110 from the data store 118. Since the reference waveform 110 is the same reference waveform that the field unit 102 used to create the delta data set 114, the waveform reconstruction module 120 combines the decompressed delta data set 114 and the reference waveform 110 to generate a reconstructed waveform 126, which is a representation of the sample waveform that the field unit 102 used to generate the delta data set 114. The waveform reconstruction module 120 may then send the reconstructed waveform 126 to a processing module 128 to analyze or otherwise make use of the reconstructed waveform 126.

In some embodiments, the field unit 102 may identify multiple reference waveforms 110, 111 and transmit the multiple reference waveforms 110, 111 to the base station 106 concurrently, sequentially, at pre-determined intervals, randomly, or otherwise. Further, in some embodiments the field unit 102 may update the reference waveform periodically to increase the likelihood of duplicate information between the reference waveform and the sampled waveforms. For example, as a machine 104 operates, one or more components of the machine may wear such that the measured machine parameter may have changed, and the current reference waveform 110 may no longer be as relevant to the current or subsequent sample waveforms. In such a case, the field unit 102 identifies a new reference waveform 111 and transmits the new reference waveform 111 over the wireless network to the base station 106, which then uses this revised reference for subsequent delta data sets 116. In some embodiments, the field unit 102 updates the reference waveform 110 at a fixed time, a random time, based on statistics of one or more of the compressed delta data sets 114, 115, a combination of these, and the like.

One example of a trigger to initiate an update to the reference waveform is a predetermined temporal increment, (i.e., days, hours, minutes, seconds, and the like), while another example is based on the quasi-periodic signal (i.e., number of cycles processed, number of sample waveforms sampled, number of delta data sets generated, and the like). In an embodiment using statistics of one or more of the compressed delta data sets 114, 115 to determine when to update the reference waveform 110 the field unit 102 maintains statistics related to the size of the compressed delta data sets 114, 115 as well as information related to a threshold, such that if the size of a predetermined number of the compressed delta data sets 114, 115 exceeds the threshold, the field unit identifies an updated reference waveform 111.

In the depicted example, the field unit wirelessly transmits reference waveform 110, then compressed delta data set 114, then compressed delta data set 115, but then determines that the size of compressed delta data set 115 (or alternatively in some embodiments, compressed delta data set 116) exceeds the threshold. As such, the field unit 102 identifies an updated reference waveform 111 and transmits the updated reference waveform 111 to the base station 106 before transmitting compressed delta data set 116 that represents the difference between the reference waveform 111 and a corresponding sample waveform. In other embodiments, the field unit 102 does not transmit a compressed delta data set 116 that exceeds the threshold unless a predetermined number of updated reference waveforms 111 fail to generate a compressed delta data set 116 of a size within the threshold. Alternatively, in some embodiments, the reference waveform 110 may be updated based on statistics of the delta data set before compression. For example, the field unit 102 may update a reference waveform when a delta data set exceeds a predetermined level of differences measured, for example, using root mean square (RMS) values.

In some embodiments, the base station 106 uses the most recently reconstructed waveform 126 as the reference waveform. This may occur at regular intervals, in response to an update indication from the field unit 102, in response to the size of the compressed delta data set 114, 115, 116 exceeding the threshold, randomly (in which case the base unit 106 would indicate to the field unit 102 to use the most recent sample waveform as the reference waveform), a combination of these, and the like.

In some embodiments, the base station 106 may store more than one reference waveform in the data store 118 concurrently. In such cases, the field unit 102 may assign a unique identifier to each reference waveform, and indicate to the base station 106 which reference waveform should be used in reconstructing a corresponding sample waveform by referencing the corresponding identifier in the wireless transmission of the delta data set, in a separate transmission, or otherwise. For example, in some embodiments, the field unit 102 may transmit a first identifier associated with the reference waveform 110 already stored in the data store 118, then transmit compressed delta data sets 114, 115 for the base station 106 to use with the first identifier, then transmit a second identifier associated with a second reference waveform 111 already stored in the data store 118 to indicate to the base station that all subsequent compressed delta data sets 116 should be used with the second reference waveform 111 until the field unit 102 transmits a subsequent identifier (which may be the first identifier associated with the first reference waveform or a third identifier associated with a third reference waveform). In the case that the field unit 102 identifies a reference waveform that is not available to the base station 106 via data store 118 or otherwise, the base station 106 may request that the field unit 102 send the identified reference waveform or an updated reference waveform.

Figure 2:
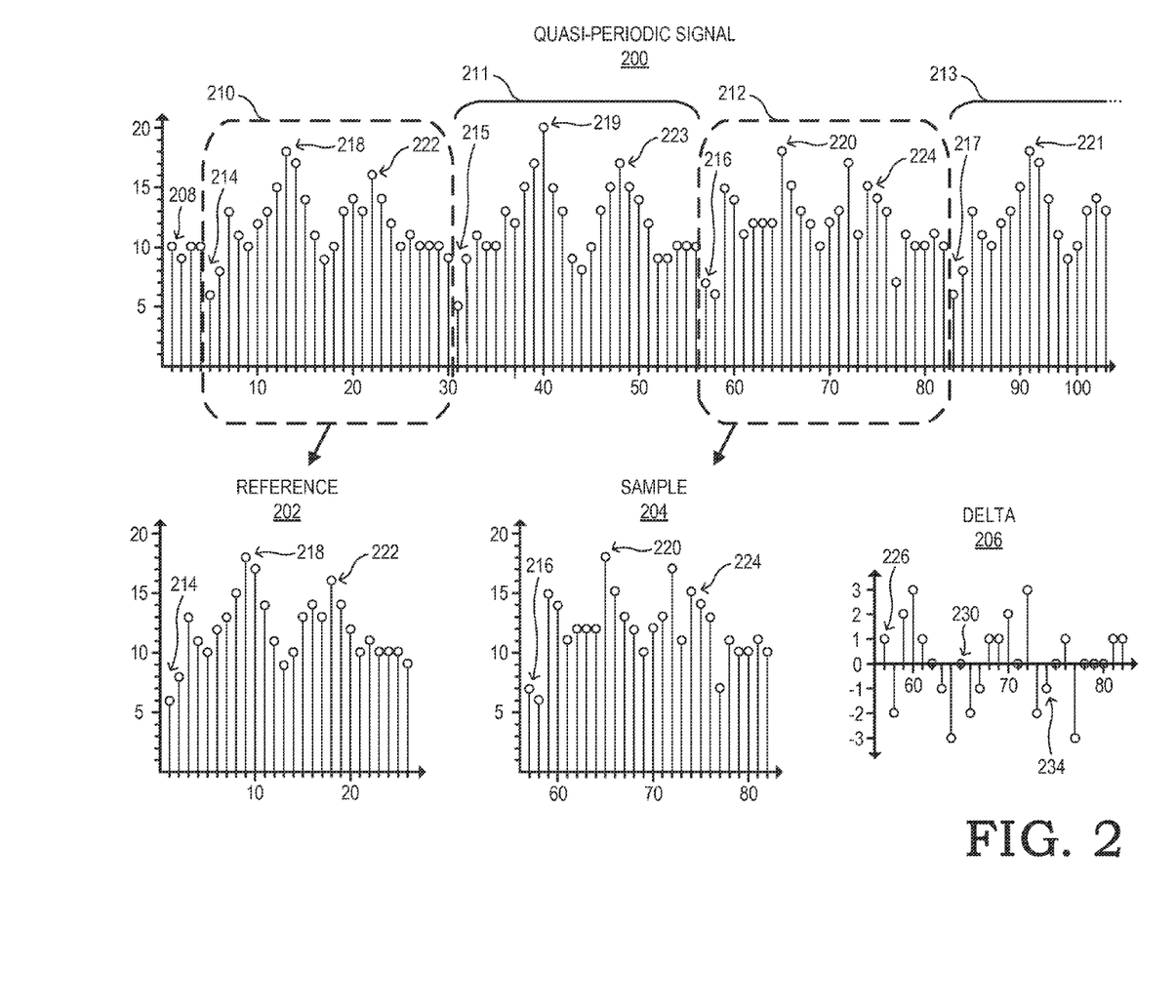
FIG. 2 is a diagram illustrating a quasi-periodic signal and an example reference waveform, sample waveform and corresponding delta data set in accordance with some embodiments.

FIG. 2 illustrates an example digital quasi-periodic signal 200 as received by the field unit 102 of the sensor sampling system 100 of FIG. 1, as well as examples of a reference waveform 202, a sample waveform 204 and a corresponding delta data set 206 that the field unit 102 generates for wireless transmission to the base station 106 in accordance with some embodiments. In the illustrated examples, each of the digital quasi-periodic signal 200, the reference waveform 202, the sample waveform 204 and the delta data set 206 are depicted relative to a vertical axis representing sampled values of a quasi-periodic sensor signal, and a horizontal axis representing temporal units, such that the first sample value 208 of the digital quasi-periodic signal 200 represents a value of ten ("10") at temporal unit one ("1"). For example, in one embodiment the digital quasi-periodic signal 200 indicates voltage over time, such that the vertical axis indicates the measured voltage at each increment of time indicated by the horizontal axis (e.g., milliseconds). Different embodiments may use temporal units other than time, for example, revolutions, cycles, counts, and the like.

In the illustrated embodiment, the digital quasi-periodic signal 200 is depicted as comprising three full cycles 210, 211, 212 and the beginning of a fourth cycle 213. While each cycle 210, 211, 212, 213 may comprise different values for any given sample value within the cycles 210, 211, 212, 213, all of the cycles 210, 211, 212, 213 share similar characteristics. For example, each cycle 210, 211, 212, 213 begins with a significant dip 214, 215, 216, 217, followed by a first significant peak 218, 219, 220, 221, and the three full cycles 210, 211, 212 comprise a second significant peak 222, 223, 224. While the depicted cycles 210, 211, 212 are depicted as twenty-six ("26") samples long, in other embodiments the cycles may comprise any size. Further, in some embodiments the field unit 102 determines the periodicity (or other information related to the cycles 210, 211, 212, 213) of the digital quasi-periodic signal 200 based on a correlation, such as an autocorrelation. In at least one embodiment, the reference waveform 202 is selected from the digital quasi-periodic signal 200 without regard to periodicity.

The field unit 102 samples the digital quasi-periodic signal 200 to generate the reference waveform 202. While the illustrated embodiment depicts the reference waveform 202 as comprising exactly one cycle 210, in other embodiments the reference waveform 202 may comprise less than a full cycle, or more than a full cycle (e.g., one and a half cycles, three cycles, and the like). The field unit 102 then samples the digital quasi-periodic signal 200 again to generate the sample waveform 204.

The field unit 102 then compares the reference waveform 202 and the sample waveform 204 to generate the delta data set 206, representing a difference between the reference waveform 202 and the sample waveform 204. While the illustrated embodiment depicts the sample waveform 204 as the same size as the reference waveform 202 for ease of illustration, in other embodiments the sample waveform may be of a different size than the reference waveform 202, and the reference waveform 202 may be phase-aligned or repeatedly compared to sections of the sample waveform 204 as necessary. To generate the delta data set 206, the field unit 102 compares each sample value of the reference waveform 202 with a corresponding sample value of the sample waveform 204, to determine a delta data value representing the difference between the two sample values.

For example, in the illustrated embodiment, sample value 214 of the reference waveform 202 has a value of six ("6"), while sample value 216 of the sample waveform 204 has a value of seven ("7"), meaning that the sample waveform 204 increases by one value at sample value 216 relative to the reference waveform 202, resulting in a delta value 226 of one ("1") for the delta data set 206. Similarly, both sample value 218 of the reference waveform 202 and sample value 220 of the sample waveform 204 have values of eighteen ("18"), meaning that the sample waveform neither increases nor decreases at sample value 220 relative to the reference waveform 202, resulting in a delta data value 230 of zero ("0") for the delta data set 206. Further, sample value 222 of the reference waveform 202 has a value of sixteen ("16"), while sample value 224 of the sample waveform 204 has a value of fifteen ("15"), meaning that the sample waveform 204 decreases by one value at sample value 224 relative to the reference waveform 202, resulting in a delta data value 234 of negative one ("−1") for the delta data set 206.

The duplicate values between sample values of cycles 210, 211, 212 of the digital quasi-periodic signal 200 in the illustrated example results in multiple delta data values of zero ("0") allowing the field unit 102 to compress the delta data set 206 or otherwise reduced the size of the delta data set 206 relative to the sample waveform 204. Moreover, filtering may be applied to further reduce the data size of the delta data set. To illustrate, a filter may be applied such that all delta data values in the delta data set 206 that are between negative one ("−1") and one ("1") are replaced with zeros, thereby allowing the filtered delta data set to be further compressed. The reduced data required to represent the sampled quasi-periodic signal 200 reduces the transmit time and power needed to wirelessly transmit this data, which permits the field unit 102 to operate longer on a given battery charge.

While in the above example the field unit 102 subtracts each sample value of the reference waveform 202 from the corresponding sample value of the sample waveform 204, in other embodiments the field unit 102 may subtract each sample value of the sample waveform 204 from the corresponding sample value of the reference waveform 202. However, in these embodiments, the base unit 106 will then need to subtract the delta data set 206 from the reference waveform 202 in order for the reconstructed waveform 126 to match the sample waveform 204.

Further, while the digital quasi-periodic signal 200, the reference waveform 202, and the sample waveform 204 in the above example are described in the context of a temporal domain, other embodiments may use a fast Fourier transform (FFT) to convert the waveforms to a frequency domain. In some embodiments, the FFT data is rotated in phase to phase align the FFT bins with the reference waveform 202. Once phase-aligned, the delta data set 206 may be calculated based on a function of the magnitude and phase of the reference waveform 202 and the sample waveform 204.

Figure 3:
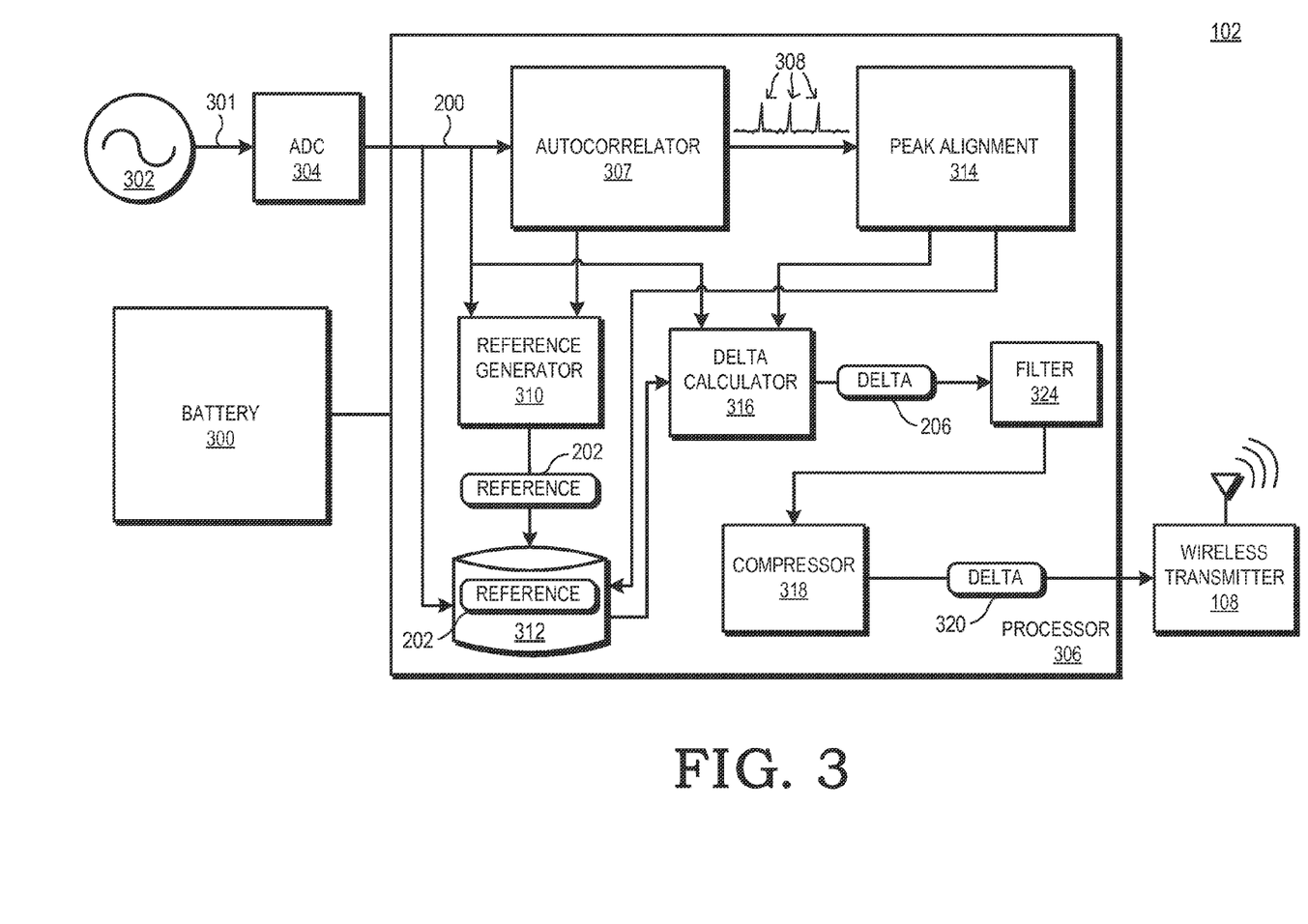
FIG. 3 is a block diagram illustrating a battery-powered field unit as used in the sensor sampling system of FIG. 1 in accordance with some embodiments.

FIG. 3 illustrates the field unit 102 as used in the sensor sampling system 100 of FIG. 1 to sample an analog quasi-periodic signal 301 in accordance with some embodiments. In the illustrated embodiment, the field unit 102 comprises at least one battery 300 to power the field unit 102; however, in other embodiments, the field unit 102 may be powered by any power source. The field unit 102 further comprise a machine sensor 302 to monitor at least one machine parameter of the machine 104 and produce an analog output voltage or current, representing the analog quasi-periodic signal 301. The machine sensor 302 may comprise, for example, an accelerometer, a displacement probe, a proximity probe, a sound probe, a velocity sensor, a voltage sensor, a current sensor, and the like. While the illustrated embodiment depicts the field unit 102 as comprising the machine sensor 302, in other embodiments the machine sensor 302 may be remote relative to the field unit 102.

The machine sensor 302 provides the quasi-periodic signal 301 to an analog-to-digital converter (ADC) 304 for conversion to the digital quasi-periodic signal 200 as shown in FIG. 2. Further, in some embodiments, the field unit 102 processes the analog output from the machine sensor 302 using any of a variety of processes, for example, low-pass filtering, high-pass filtering, band-pass filtering, gain adjustment, non-linear adjustments, noise mitigation, zero crossing detection, level detection, distortion correction, limiting, rectification, and other types of linear or non-linear processes.

The ADC 304 sends the digital quasi-periodic signal 200 to a processor 306, for example, a Field Programmable Gate Array (FPGA) or a Digital Signal Processor (DSP). In at least one embodiment, the processor 306 sends the digital quasi-periodic signal 200 to an autocorrelator 307 to determine the periodicity of the digital quasi-periodic signal 200 based on a correlation, for example, an autocorrelation. Given the nature of the digital quasi-periodic signal 200, repetitive information may be found in the cycles of the digital quasi-periodic signal 200, and the autocorrelator 307 uses this repetitive information to identify the periodicity of the digital quasi-periodic signal 200. In the illustrated embodiment, the periodicity is represented by peaks 308, but other embodiments may use any of a variety of mechanisms to indicate the periodicity of the digital quasi-periodic signal 200. In some embodiments the autocorrelator 307 provides information related to the periodicity to a reference generator 310, to generate the reference waveform 202 based on the periodicity of the digital quasi-periodic signal 200, while in other embodiments the reference generator 310 generates the reference waveform 202 without regard to the periodicity of the digital quasi-periodic signal 200. The reference generator 310 then sends the reference waveform 202 to a data store 312 to maintain the reference waveform 202 until needed by another component of the field unit 102. The data store 312 of various embodiments may also maintain data related to the digital quasi-periodic signal 200, the sample waveform 204, the delta data set 206, or other information used or produced by the processor 306. Further, while the data store 312 is depicted at the processor 306, other embodiments may comprise an off-chip data store, or a combination of on-chip and off-chip data stores.

A peak alignment module 314 uses the peaks 308 or other periodicity information provided by the autocorrelator 307 to align the sample waveform 204 to the corresponding reference waveform 202 and indicate to a delta calculator 316 at what point or points of the sample waveform 204 the delta calculator 316 is to begin comparing the reference waveform 202 with the sample waveform 204. In some embodiments, the peak alignment module 314 may further identify and send to the data store 312 a peak offset to indicate that the delta calculator 316 is to begin comparing the reference waveform 202 to the sample waveform 204 at a certain offset relative to a given peak 308. The peak alignment module 314 helps to increase the likelihood of overlapping data points between the reference waveform 202 and the sample waveform 204, thereby increasing the chances of the delta calculator 316 generating a delta data set 206 that may be compressed by a compressor 318 to generate a compressed delta data set 320 that is of reduced size relative to the sample waveform 204. The wireless transmitter 108 may then transmit the compressed delta data set 320 to the base station 106, and given the reduced size of the compressed delta data set relative to the sample waveform 204, the transmit time and power needed to wirelessly transmit this data is also decreased, which extends the life of the battery 300, and permits the field unit 102 to operate longer on a given battery charge.

In some embodiments, a filter 324 identifies and removes noise or other small values from the delta data set 206 before the compressor 318 generates the compressed delta data set 320. The filter 324 identifies an average noise floor for the delta data set 320, and forces the values within the boundaries of the noise floor to zero ("0"), so as highlight the significant data values and allow for a more effective compression of the delta data set 206. In many instances, the filter 324 allows for a compressed delta data set 320 of reduced size relative to a compressed delta data set 320 that was not filtered prior to compression.

Figure 4:
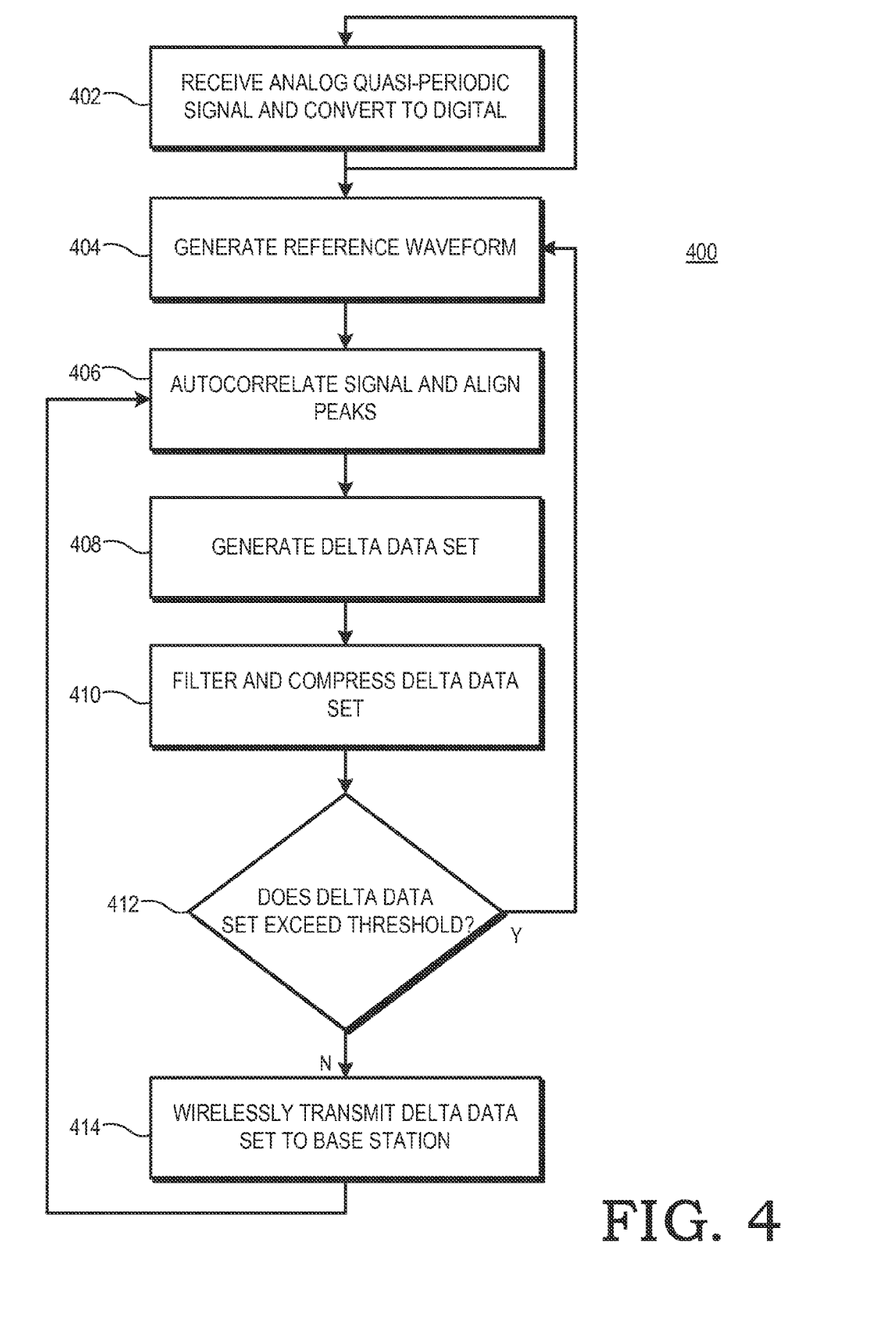
FIG. 4 is a flow diagram illustrating a correlative sampling and compression method for wirelessly transmitting quasi-periodic signal data in accordance with some embodiments.

FIG. 4 illustrates a correlative sampling and compression method 400 for wirelessly transmitting quasi-periodic signal data from the field unit 102 of FIGS. 1 and 3, to the base station of FIG. 1 in accordance with some embodiments. At block 402, the field unit 102 receives the analog quasi-periodic signal 301 representing the machine parameter monitored by the machine sensor 302. The field unit 102 converts the analog quasi-periodic signal 301 of the machine sensor 302 to a digital quasi-periodic signal, such as the digital quasi-periodic signal 200 of FIG. 2, using, for example, the ADC 304. The field unit 102 samples the digital quasi-periodic signal 200 to generate a sample waveform, such as the sample waveform 204 of FIG. 2.

Contemporaneously or in parallel, at block 404, the field unit 102 samples the digital quasi-periodic signal 200 to generate a reference waveform, such as the reference waveform 202 of FIG. 2, using a reference generator 310. The field unit 102 may select any portion of a cycle of the digital quasi-periodic signal 200, an entire cycle, or more than a cycle as the reference waveform 202. In some embodiments, the field unit 102 uses an autocorrelator 307 to help identify the periodicity of the digital quasi-periodic signal 200, and from there identify a reference waveform that is more likely to result in a compressed delta data set 320 of a reduced size. The field unit 102 wirelessly transmits the reference waveform 202 to the base station 106 via the wireless transmitter 108.

At block 406, the autocorrelator 307 of the field unit 102 correlates the data to identify the periodicity using as series of peaks 308. The peak alignment module 314 then uses the peaks 308 to align the sample waveform 204, or otherwise indicate to the delta calculator 316 how to align the reference waveform 202 with the sample waveform 204.

At block 408, the delta calculator of the field unit 102 compares the reference waveform 202 with the sample waveform 204 to calculate a delta data set, such as delta data set 206 of FIG. 2. The delta data set 206 comprises a series of data values indicating the difference between the respective corresponding data values of the reference waveform 202 and the sample waveform 204, such that overlapping data values will result in a delta data value of zero ("0").

At block 410, the filter 324 reduces or removes noise from the delta data set 206 by identifying an average noise floor and forcing delta data values within the boundaries of the noise floor to zero ("0"). In some embodiments, the delta data set 206 is not filtered for noise. Further at block 410, the compressor 318 compresses the delta data set 206 to generate a compressed delta data set 320 using any of a variety of compression techniques or algorithms, for example, Lempel-Ziv (LZ), probabilistic modeling, run-length encoding, block-sorting compression, a combination of these, and the like. In many instances, the compressed delta data set 320 will be of a data size that is less than the data size of the sample waveform 204.

In some embodiments, in an effort to avoid taxing the wireless network with large delta data sets 206, a threshold is designated for the data size of the compressed delta data set 320. In these embodiments, at block 412, the field unit 102 assesses whether the compressed delta data set 320 exceeds the threshold. If the size of the delta data set 206 exceeds the threshold, the field unit 102 generates a new reference waveform 202 (returning to block 404) in an effort to identify a reference waveform 202 with more duplicate data relative to the sample waveform 204, resulting in a reduced compressed delta data set 320.

If the field unit 102 determines that the size of the compressed delta data set 320 does not exceed the threshold, the method proceeds to block 414, whereby the field unit 102 wirelessly transmits the compressed delta data set 320 to the base station 106 via the wireless transmitter 108. The method 400 then returns to block 406, whereby the field unit 102 uses a new sample waveform 204 and repeats the steps to generate a new delta data set 206 representative of the new sample waveform 204. When the base station 106 receives both the reference waveform 202 and the compressed delta data set 320 from the field unit 102, the base station 106 may proceed to reconstruct a representation of the sample waveform 104. For example, in some embodiments, the base station 106 decompresses the compressed delta data set 320 to generate a representation of the delta data set 206. The base station 106 then combines the delta data set 206 and the reference waveform 202 to generate a representation of the sample waveform 204.

By using this correlative sampling and compression method 400, the base station 106 is able to receive the same information regarding the sample waveform 204 of the digital quasi-periodic signal 200 as conventional methods while reducing the amount of data transmitted over the wireless network to represent the sample waveform 204. Thus, the methods and systems described above reduce the transmit time and power needed to wirelessly transmit the digital quasi-periodic signal 200 representing machine parameter data, which permits the field unit 102 to operate longer on a given battery charge and consume less radio transmit time.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   receiving, at a field unit, a quasi-periodic signal representing machine parameters monitored by a machine sensor;
   sampling, at the field unit, a first portion of the quasi-periodic signal to generate a first reference waveform;
   sampling, at the field unit, a second portion of the quasi-periodic signal to generate a first sample waveform;
   generating, at the field unit, a first delta data set representing a difference between the first reference waveform and the first sample waveform;
   compressing the first delta data set to generate a compressed delta data set; and
   wirelessly transmitting a representation of the compressed delta data set from the field unit for reception by a base station.

2. The method of claim 1, further comprising:
   determining an autocorrelation for the quasi-periodic signal; and
   wherein sampling the first portion of the quasi-periodic signal comprises sampling the first portion of the quasi-periodic signal based on the autocorrelation.

3. The method of claim 1, wherein generating the first delta data set comprises:
   phase-aligning the first reference waveform and the first sample waveform based on an autocorrelation of the quasi-periodic signal; and
   determining the first delta data set based on a difference between the phase-aligned first reference and first sample waveforms.

4. The method of claim 1, further comprising:
   performing a noise-suppression process on the first delta data set prior to compressing the first delta data set.

5. The method of claim 1, further comprising:
   wirelessly transmitting a representation of the first reference waveform for reception by the base station.

6. The method of claim 5, further comprising:
storing, at the base station, the representation of the first reference waveform; and
generating, at the base station, a representation of the first sample waveform based on the stored first reference waveform and the first delta data set.

7. A method comprising:
receiving, at a field unit, a quasi-periodic signal representing machine parameters monitored by a machine sensor;
sampling, at a field unit, a first portion of the quasi-periodic signal to generate a first reference waveform,
sampling, at a field unit, a second portion of the quasi-periodic signal to generate a first reference waveform,
generating, at the field unit, a first delta data set representing a difference between the first reference waveform and the first sample waveform; and
wirelessly transmitting a representation of the first delta data set from the field unit for reception by a base station;
wirelessly transmitting a representation of the first reference waveform for reception by a base station;
sampling, at the field unit, a third portion of the quasi-periodic signal to generate a second reference waveform;
wirelessly transmitting a representation of the second reference waveform for reception by the base station; and
storing the first and second reference waveforms at the base station.

8. The method of claim 7, further comprising:
sampling, at the field unit, a fourth portion of the quasi-periodic signal to generate a second sample waveform;
generating, at the field unit, a second delta data set representing a difference between the second reference waveform and the second sample waveform;
wirelessly transmitting a representation of the second delta data set from the field unit for reception by the base station;
wherein wirelessly transmitting the representation of the first delta data set includes wirelessly transmitting a first identifier associated with the first reference waveform for reception by the base station; and
wherein wirelessly transmitting the representation of the second delta data set includes wirelessly transmitting a second identifier associated with the second reference waveform for reception by the base station.

9. The method of claim 1, further comprising:
generating, at the base station, a representation of the first sample waveform based on the first reference waveform and the first delta data set.

10. A method comprising:
receiving, at a field unit, a quasi-periodic signal representing machine parameters monitored by a machine sensor;
sampling, at a field unit, a first portion of the quasi-periodic signal to generate a first reference waveform,
sampling, at a field unit, a second portion of the quasi-periodic signal to generate a first reference waveform,
generating, at the field unit, a first delta data set representing a difference between the first reference waveform and the first sample waveform; and
wirelessly transmitting a representation of the first delta data set from the field unit for reception by a base station;
wirelessly transmitting a representation of the first reference waveform for reception by a base station;
sampling, at the field unit, a third portion of the quasi-periodic signal to generate a second sample waveform;
generating, at the field unit, a second delta data set representing a difference between the first reference waveform and the second sample waveform; and
wirelessly transmitting a representation of the second delta data set from the field unit for reception by the base station.

11. A non-transitory computer readable storage medium embodying a set of executable instructions, the set of executable instructions to manipulate at least one processor to:
receive, at a field unit, a quasi-periodic signal representing machine parameters monitored by a machine sensor;
sample, at the field unit, a first portion of the quasi-periodic signal to generate a first reference waveform;
sample, at the field unit, a second portion of the quasi-periodic signal to generate a first sample waveform;
generate, at the field unit, a first delta data set representing a difference between the first reference waveform and the first sample waveform;
compress, at the field unit, the first delta data set to generate a compressed delta data set; and
wirelessly transmit a representation of the compressed delta data set from the field unit for reception by a base station.

12. A system comprising:
a base station; and
a field unit, the field unit to:
receive a quasi-periodic signal representing machine parameters monitored by a machine sensor;
sample a first portion of the quasi-periodic signal to generate a first reference waveform;
sample a second portion of the quasi-periodic signal to generate a first sample waveform;
generate a first delta data set representing a difference between the first reference waveform and the first sample waveform;
compress the first delta data set to generate a compressed delta data set; and
wirelessly transmit a representation of the compressed delta data set for reception by the base station.

13. The system of claim 12, wherein:
the field unit further is to determine an autocorrelation for the quasi-periodic signal; and
the field unit is to sample the first portion of the quasi-periodic signal by sampling the first portion of the quasi-periodic signal based on the autocorrelation.

14. The system of claim 12, wherein the field unit is to generate the first delta data set by:
phase-aligning the first reference waveform and the first sample waveform based on an autocorrelation of the quasi-periodic signal; and
determining the first delta data set based on a difference between the phase-aligned reference and first sample waveforms.

15. The system of claim 12, wherein the field unit further is to:
perform a noise-suppression process on the first delta data set prior to compressing the first delta data set.

16. The system of claim 12, wherein the field unit further is to:
wirelessly transmit a representation of the first reference waveform for reception by the base station.

17. The system of claim 16, wherein the base station is to:
store the representation of the first reference waveform; and generate a representation of the first sample waveform based on the stored first reference waveform and the first delta data set.

18. A system comprising:
a base station;
a field unit, the field unit to:
   receive a quasi-periodic signal representing machine parameters monitored by a machine sensor;
   sample a first portion of the quasi-periodic signal to generate a first reference waveform;
   sample a second portion of the quasi-periodic signal to generate a first sample waveform;
   generate a first delta data set representing a difference between the first reference waveform and the first sample waveform;
   wirelessly transmit a representation of the first delta data set for reception by the base station;
   sample a third portion of the quasi-periodic signal to generate a second reference waveform; and
   wirelessly transmit a representation of the second reference waveform for reception by the base station; and
the base station is to store the first and second reference waveforms.

19. The system of claim 18, wherein the field unit further is to:
   sample a fourth portion of the quasi-periodic signal to generate a second sample waveform;
   generate a second delta data set representing a difference between the second reference waveform and the second sample waveform;
   wirelessly transmit a representation of the second delta data set for reception by the base station;
   wirelessly transmit a first identifier associated with the first reference waveform with the wireless transmission of the representation of the first delta data set for reception by the base station; and
   wirelessly transmit a second identifier associated with the second reference waveform with the wireless transmission of the representation of the second delta data set for reception by the base station.

20. The system of claim 12, wherein the base unit is to:
generate a representation of the first sample waveform based on the first reference waveform and the representation of the first delta data set.

21. A system comprising:
a base station;
a field unit, the field unit to:
   receive a quasi-periodic signal representing machine parameters monitored by a machine sensor;
   sample a first portion of the quasi-periodic signal to generate a first reference waveform;
   sample a second portion of the quasi-periodic signal to generate a first sample waveform;
   generate a first delta data set representing a difference between the first reference waveform and the first sample waveform;
   wirelessly transmit a representation of the first delta data set for reception by the base station;
   sample a third portion of the quasi-periodic signal to generate a second sample waveform;
   generate a second delta data set representing a difference between the first reference waveform and the second sample waveform; and
   wirelessly transmit a representation of the second delta data set from the field unit for reception by the base station.

22. The system of claim 12, wherein the field unit comprises at least one battery.

* * * * *